United States Patent
Chen et al.

(10) Patent No.: US 11,552,659 B2
(45) Date of Patent: Jan. 10, 2023

(54) TRANSMISSION CIRCUIT AND TRANSMISSION SYSTEM ADOPTING REDUCED NUMBER OF INTERFACES

(71) Applicant: Realtek Semiconductor Corp., HsinChu (TW)

(72) Inventors: Yan-Guei Chen, HsinChu (TW); Liang-Wei Huang, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/482,474

(22) Filed: Sep. 23, 2021

(65) Prior Publication Data

US 2022/0094377 A1    Mar. 24, 2022

(30) Foreign Application Priority Data

Sep. 24, 2020 (TW) ................................ 109133002

(51) Int. Cl.
*H04B 1/04* (2006.01)
*H04L 1/00* (2006.01)
*H03M 9/00* (2006.01)
*H04B 1/18* (2006.01)

(52) U.S. Cl.
CPC ............ *H04B 1/0483* (2013.01); *H03M 9/00* (2013.01); *H04B 1/18* (2013.01); *H04L 1/0071* (2013.01)

(58) Field of Classification Search
CPC .......... H04B 1/04; H04B 1/0483; H04B 1/18; H03M 9/00; H04L 1/0065; H04L 1/0066; H04L 1/0071; H04L 1/0075
See application file for complete search history.

(56) References Cited

U.S. PATENT DOCUMENTS

| 7,466,668 | B2 | 12/2008 | Dove |
| 8,565,354 | B2* | 10/2013 | Chang ................... H04L 1/0078 375/253 |
| 8,838,822 | B2* | 9/2014 | Spalla ................... H04L 1/0057 370/506 |
| 9,112,520 | B2* | 8/2015 | Gu ........................... H03M 9/00 |
| 2008/0101402 | A1* | 5/2008 | Feng ..................... H04L 69/324 370/463 |
| 2021/0076387 | A1* | 3/2021 | Papasakellariou .. H04W 52/248 |

FOREIGN PATENT DOCUMENTS

| TW | 200623689 | 7/2006 |
| TW | 201223220 A1 | 6/2012 |

\* cited by examiner

*Primary Examiner* — Quochien B Vuong
(74) *Attorney, Agent, or Firm* — Winston Hsu (57) ABSTRACT

A transmission circuit includes a data input pin, a serial-to-parallel converter, an interface decoder, a parallel-to-serial converter, and a processor circuit. The serial-to-parallel converter is electrically coupled to the data input pin. The serial-to-parallel converter converts a plurality of data signals received by the first data input pin into a set of parallel data signals. The interface decoder is electrically coupled to the serial-to-parallel converter. The interface decoder decodes the set of parallel data signals to generate a set of decoded data signals for parallel transmission. The parallel-to-serial converter is electrically coupled to the interface decoder. The parallel-to-serial converter converts the set of decoded data signals into a plurality of input data signals for serial transmission. The processor circuit is electrically coupled to the parallel-to-serial converter. The processor circuit receives and processes the plurality of input data signals.

17 Claims, 4 Drawing Sheets

TRANSMISSION CIRCUIT AND TRANSMISSION SYSTEM ADOPTING REDUCED NUMBER OF INTERFACES

CROSS REFERENCE TO RELATED APPLICATION

This non-provisional application claims priority of Taiwan patent application No. 109133002, filed on 24 Sep. 2020, included herein by reference in its entirety.

BACKGROUND OF THE INVENTION

1. Field of the Invention

The present invention relates to a transmission circuit, in particular, to a transmission circuit adopting a reduced number of interfaces.

2. Description of the Prior Art

In the art, a gigabit media independent interface (GMII) or a reduced gigabit media independent interface (RGMII) are typically used for data transmission between the physical layer and the data link layer. The gigabit media independent interface includes 2 clock interfaces, 8 data input interfaces, 8 data output interfaces, 2 output control signal interfaces and 2 input control signal interfaces. In each clock cycle, each data interface of the gigabit media independent interface may transmit or receive a one-bit signal. Due to the large number of interfaces adopted in the gigabit media independent interface, the internal wiring of the chip is complex, resulting in an increase in the overall circuit size, and leading to complex inflexible designs of external circuits.

In order to reduce the number of interfaces, the reduced gigabit media independent interface may transmit a 1-bit signal at the time upon each rising and falling edge of the clock. In this manner, when the number of data interfaces is halved, the reduced gigabit media independent interface may still operate at the same transmission frequency as the gigabit media independent interface. Nevertheless, the number of interfaces will be fixed regardless of a reduced gigabit media independent interface or a gigabit media independent interface being used, and the circuit design is inflexible even if an application adopts a lower transmission rate.

SUMMARY OF THE INVENTION

According to an embodiment of the invention, a transmission circuit includes a first data input interface, a first serial-to-parallel converter, an interface decoder, a first parallel-to-serial converter and a processor circuit. The first serial-to-parallel converter is electrically coupled to the first data input interface, and is used to convert at least a plurality of first data signals from the first data input interface into a set of first parallel data signals, the set of first parallel data signals including a plurality of bit signals transmitted in parallel. The interface decoder is electrically coupled to the first serial-to-parallel converter, and is used to decode the set of first parallel data signals to generate a set of decoded data signals for parallel transmission. The first parallel-to-serial converter is electrically coupled to the interface decoder, and is used to convert the set of decoded data signals into a plurality of input data signals for serial transmission. The processor circuit is electrically coupled to the first parallel-to-serial converter, and is used to receive and process the plurality of input data signals.

According another embodiment of the invention, a transmission system includes an upper-layer transmission circuit, a first lower-layer transmission circuit and a second lower-layer transmission circuit. The upper-layer transmission circuit includes a first upper-layer output interface and a second upper-layer output interface. The first lower-layer transmission circuit includes a first data input interface, a first serial-to-parallel converter, a first interface decoder, a first parallel-to-serial converter and a first processor circuit. The first data input interface is electrically coupled to the first upper-layer output interface of the upper-layer transmission circuit. The first serial-to-parallel converter is electrically coupled to the first data input interface, and is used to convert at least a plurality of first data signals from the first data input interface into a set of first parallel data signals, the set of first parallel data signals including a plurality of bit signals transmitted in parallel. The first interface decoder is electrically coupled to the first serial-to-parallel converter, and is used to decode the set of first parallel data signals to generate a set of first decoded data signals for parallel transmission. The first parallel-to-serial converter is electrically coupled to the first interface decoder, and is used to convert the set of first decoded data signals into a plurality of first input data signals for serial transmission. T first processor circuit is electrically coupled to the first parallel-to-serial converter, and is used to receive and process the plurality of first input data signals. The second lower-layer transmission circuit includes a second data input interface, a second serial-to-parallel converter, a second interface decoder, a second parallel-to-serial converter and a second processor circuit. The second data input interface is electrically coupled to the second upper-layer output interface of the upper-layer transmission circuit. The second serial-to-parallel converter is electrically coupled to the second data input interface, and is used to convert at least a plurality of second data signals from the second data input interface into a set of second parallel data signals, the set of second parallel data signals including a plurality of bit signals transmitted in parallel. The second interface decoder is electrically coupled to the second serial-to-parallel converter, and is used to decode the set of second parallel data signals to generate a set of second decoded data signals for parallel transmission. The second parallel-to-serial converter is electrically coupled to the second interface decoder, and is used to convert the set of second decoded data signals into a plurality of second input data signals for serial transmission. T second processor circuit is electrically coupled to the second parallel-to-serial converter, and is used to receive and process the plurality of second input data signals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
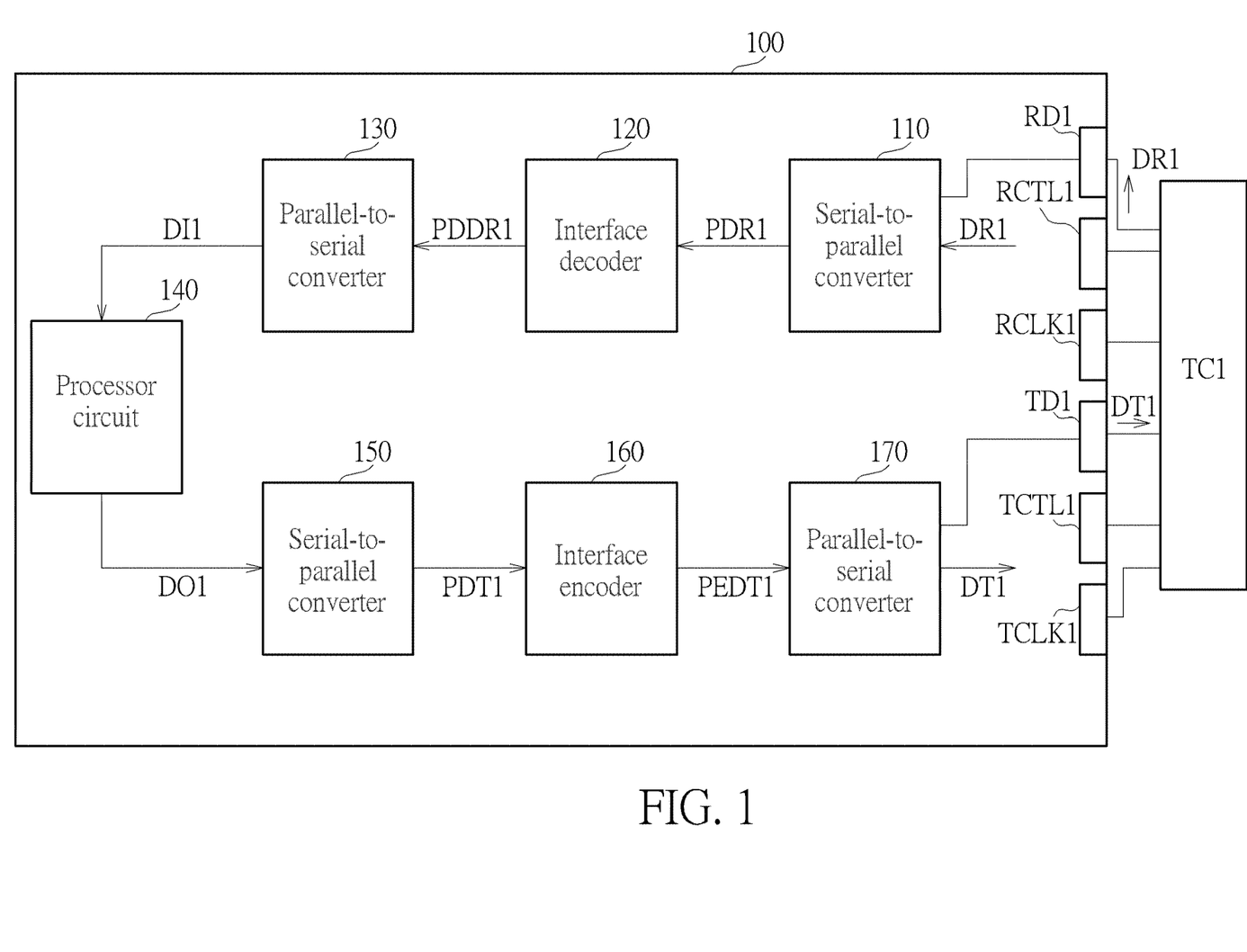
FIG. 1 is a schematic diagram of a transmission circuit according to an embodiment of the invention.

FIG. 1 is a schematic diagram of a transmission circuit 100 according to an embodiment of the invention. In FIG. 1, the transmission circuit 100 may be electrically coupled to another transmission circuit TC1, and may perform data transmission with the transmission circuit TC1. In some embodiments, the transmission circuit 100 may be a physical layer transmission circuit, and the transmission circuit TC1 may be a data link layer transmission circuit. In the related art, if a reduced gigabit media independent interface (RGMII) is used for data transmission between the transmission circuit for the physical layer and the transmission circuit for the data link layer, each of the two transmission circuits must include four uplink data transmission interfaces and four downlink data transmission interfaces, resulting in an inflexible design. In contrast, the transmission circuit 100 may perform uplink data transmission via a transmission interface and/or perform downlink data transmission via a transmission interface.

The data input interface RD1 may sequentially receive a plurality of data signals DR1 from a corresponding interface of the transmission circuit TC1. The serial-to-parallel converter 110 may be electrically coupled to the data input interface RD1, and may convert a plurality of data signals DR1 from the data input interface RD1 into a set of parallel data signals PDR1. The set of parallel data signals PDR1 may include a plurality of bit signals for parallel transmission.

The interface decoder 120 may be electrically coupled to the serial-to-parallel converter 110, and may decode the set of parallel data signals PDR1 to generate a set of decoded data signals PDDR1 for parallel transmission. In some embodiments, the interface decoder 120 may decode the set of parallel data signals PDR1 according to the RGMII specification. In such a case, the set of parallel data signals PDR1 may include 8 synchronously transmitted bit signals. Since the serial-to-parallel converter 110 may convert a plurality of data signals DR1 for serial transmission into a set of parallel data signals PDR1 for parallel transmission, the interface decoder 120 may use the decoding mechanism commonly used for reduced gigabit media independent interfaces to perform decoding without redesigning the circuit, thereby reducing complexity of the circuit design.

In addition, in the process of converting the plurality of data signals DR1 into the set of parallel data signals PDR1 for parallel transmission, it is necessary to wait for all bits of data in the set of parallel data signals PDR1 to be received before they can be output together. Therefore, the interface decoder 120 may operate at a lower frequency and reduce power consumption. For example, if the frequency of the clock of the transmission circuit 100 is 125 MHz, the rate of data transmission between the transmission circuit 100 and the TC1 may reach 250 Mbits per second if the transmission data is determined upon both the rising and falling edges. In such a case, if the set of parallel data signals PDR1 includes 8 bits, the clock of the interface decoder 120 only needs to operate at 31.25 MHz to meet the target data transmission rate. In other words, the transmission circuit 100 may perform other functions that also adopt the reduced gigabit media independent interface by adjusting the operating frequency of the interface decoder 120, so as to achieve circuit sharing.

The parallel-to-serial converter 130 may be electrically coupled to the interface decoder 120 and may convert the set of decoded data signals PDDR1 into a plurality of input data signals DI1 for serial transmission. The processor circuit 140 may be electrically coupled to the parallel-to-serial converter 130, and may receive and process the plurality of input data signals DI1.

In FIG. 1, the transmission circuit 100 may also transmit data to the transmission circuit TC1. For example, the processor circuit 140 may also generate a plurality of output data signals DO1 for serial transmission. The transmission circuit 100 may further include a serial-to-parallel converter 150, an interface encoder 160, a parallel-to-serial converter 170, and a data output interface TD1.

The serial-to-parallel converter 150 may be electrically coupled to the processor circuit 140 and may convert the plurality of output data signals DO1 into a set of parallel data signals PDT1, and the set of parallel data signals PDT1 may include a plurality of pieces of bit data transmitted in parallel.

The interface encoder 160 may be electrically coupled to the serial-to-parallel converter 150, and may encode the set of parallel data signals PDT1 to generate a set of encoded data signals PEDT1 for parallel transmission. In some embodiments, the interface decoder 120 and the interface encoder 160 may be implemented by two separate circuits. In other embodiments, the interface decoder 120 and the interface encoder 160 may be integrated together, or may share a portion of functional blocks.

The parallel-to-serial converter 170 may be electrically coupled to the interface encoder 160, and may convert the set of encoded data signals PEDT1 into a plurality of data signals DT1 for serial transmission, and the data output interface TD1 may serially output the plurality of data signals DT1 to the transmission circuit TC1.

Since the transmission circuit 100 may internally convert a serial data signal into parallel data signals, and then convert the parallel data signals back into a serial data signal, a single data input interface RD1 may be used to receive data from the transmission circuit TC1, and a single data output interface TD1 may be used to output data to the transmission circuit TC1. In some embodiments, the transmission circuit 100 may also use two or three data input interfaces to receive data from the transmission circuit TC1, and use two or three data output interfaces to output data to the transmission circuit TC1.

Figure 2:
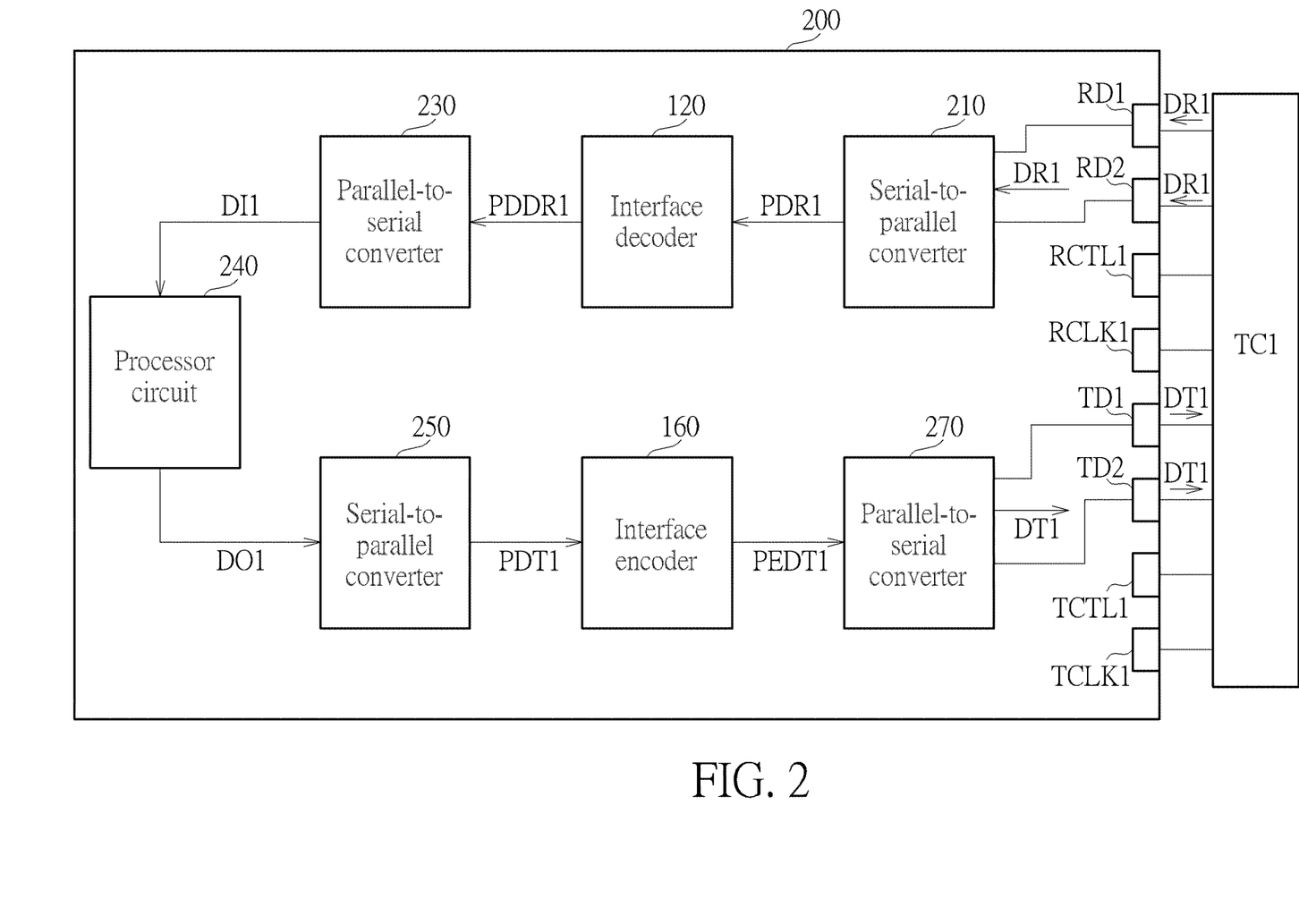
FIG. 2 is a schematic diagram of a transmission circuit according to another embodiment of the invention.

FIG. 2 is a schematic diagram of a transmission circuit 200 according to an embodiment of the invention. The transmission circuits 100 and 200 may be similar in structure and operate in similar principle. The transmission circuit 200 may further include a data input interface RD2 and a data output interface TD2.

In such a case, the data input interfaces RD2 and RD1 may receive the data signal DR1 together. In other words, in the case where the clock frequency is maintained at 125 MHz, the data signal may be received in parallel via the data input interfaces RD1 and RD2 to achieve a transmission rate of 250 Mbits per second. In such a case, the serial-to-parallel converter 210 may convert a plurality of data signals DR1 received from the data input interfaces RD1 and RD2 into a set of parallel data signals PDR1. In this fashion, the transmission circuit 200 may also adopt the interface decoder 120 for decoding. In addition, in this embodiment, the operating frequency of the interface decoder 120 may be adjusted to 62.5 MHz to match the data rate at which the transmission circuit 200 receives the data signal DR1 to maintain the transmission rate at 250 Mbits per second.

Next, the parallel-to-serial converter 230 may convert a set of decoded data signals PDDR1 into a plurality of input data signals DI1 for serial transmission, and the processor circuit 240 may receive and process the plurality of input data signals DI1.

Similarly, when the transmission circuit 200 is configured to transmit the data signal DT1 to the transmission circuit TC1, the processor circuit 240 may generate a plurality of output data signals DO1 for serial transmission, and the serial-to-parallel converter 250 may convert the plurality of output data signals DO1 into a set of parallel data signals PDT1, and the interface encoder 160 may decode the same to generate a set of encoded data signals PEDT1. The parallel-to-serial converter 270 may then convert the set of encoded data signals PEDT1 into a plurality of data signals DT1 for serially transmission, and then output the plurality of serial data signals DT1 in parallel to the transmission circuit TC1 via the data output interface TD1 and the data output interface TD2.

In other words, by adopting the serial-to-parallel conversion mechanism, the transmission circuit may select an appropriate number of data interfaces based on the transmission requirements to perform the data transmission of the reduced gigabit media independent interface, achieving a flexible circuit design.

Further, in FIGS. 1 and 2, the transmission circuit 100 may include an output control interface TCTL1, an output clock interface TCLK1, an input control interface RCTL1 and an input clock interface RCLK1. When the transmission circuit 100 outputs data using the data output interface TD1, the transmission circuit 100 may output a control signal via the output control interface TCTL1, and output a clock signal via the output clock interface TCLK1 for the transmission circuit TC1 to receive data properly. In contrast, when receiving the data using the data input interface RD1, the input control interface RCTL1 may receive the control signal, and the input clock interface RCLK1 may receive the clock signal for the transmission circuit 100 to receive the data properly.

In some embodiments, the transmission circuits may perform transmissions based on a single-input multiple-output approach. For example, an upper-layer transmission circuit associated with the data link layer may be electrically coupled to a plurality of lower-layer transmission circuits associated with the physical layer to perform data transmission. In such a case, the plurality of lower-layer transmission circuits may be commonly electrically coupled to the control interface and the clock interface of the upper-layer transmission circuit to reduce the wiring between transmission circuits associated with the two layers.

Figure 3:
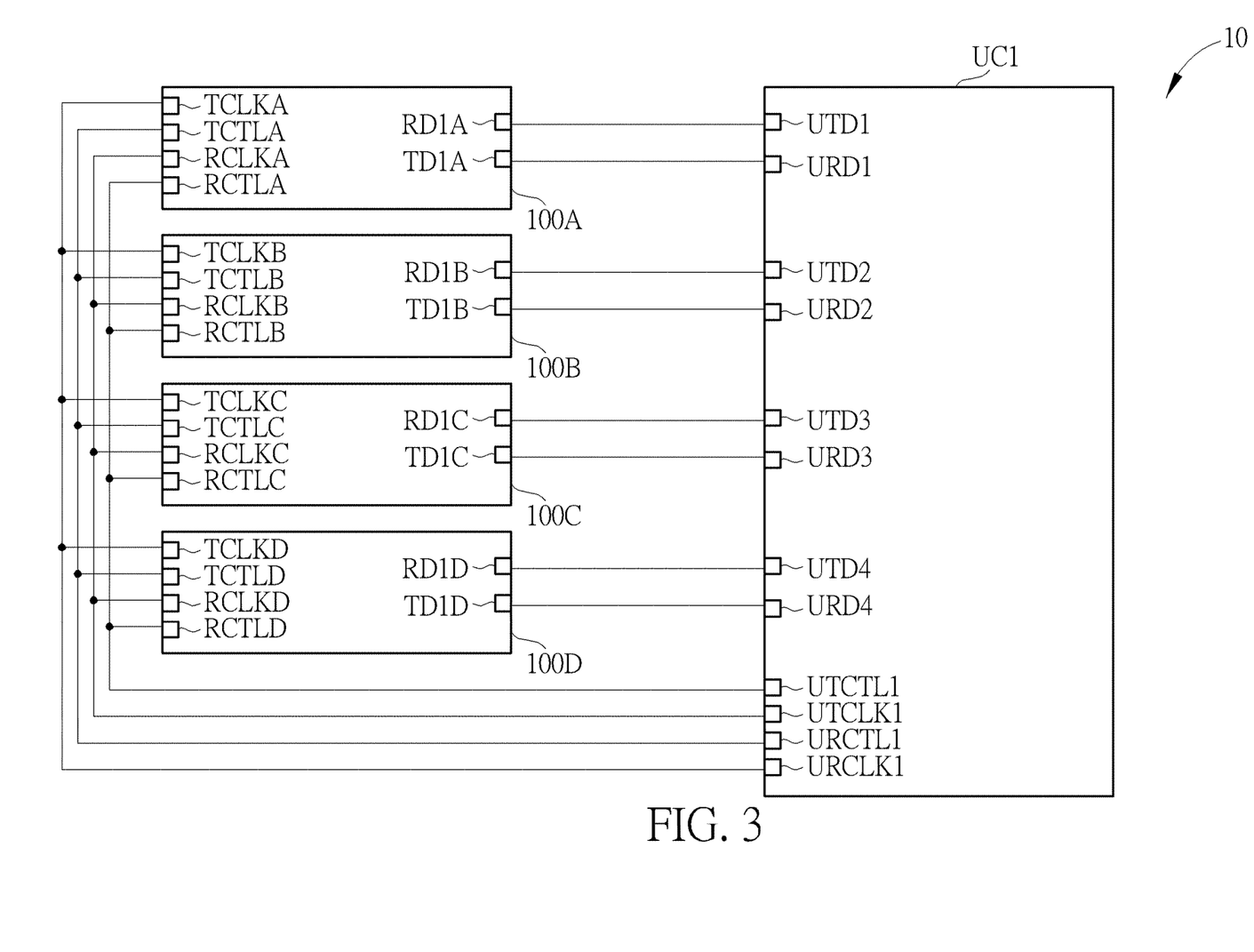
FIG. 3 is a schematic diagram of a transmission system according to an embodiment of the invention.

FIG. 3 is a schematic diagram of a transmission system 10 according to an embodiment of the invention. In FIG. 3, the transmission system 10 may include lower-layer transmission circuits 100A, 100B, 100C, and 100D, and an upper-layer transmission circuit UC1. In some embodiments, the lower-layer transmission circuits 100A, 100B, 100C, and 100D and the transmission circuit 100 may have identical structures, and may operate in identical principles, and the upper-layer transmission circuit UC1 and the transmission circuit TC1 may have identical structures and may operate in identical principles. For example, the upper-layer transmission circuit UC1 may be a transmission circuit corresponding to the data link layer, and the lower-layer transmission circuits 100A, 100B, 100C, and 100D may be a transmission circuit corresponding to the physical layer.

In FIG. 3, the upper-layer transmission circuit UC1 may include upper-layer output interfaces UTD1, UTD2, UTD3 and UTD4, upper-layer input interfaces URD1, URD2, URD3 and URD4, an upper-layer output control interface UTCTL1, an upper-layer output clock interface UTCLK1, an upper-layer input control interface URCTL1 and an upper-layer input clock interface URCLK1.

In such a case, the data input interface RD1A of the lower-layer transmission circuit 100A may be electrically coupled to the upper-layer output interface UTD1, and the data output interface TD1A of the lower-layer transmission circuit 100A may be electrically coupled to the upper-layer input interface URD1. The data input interface RD1B of the lower-layer transmission circuit 100B may be electrically coupled to the upper-layer output interface UTD2, and the data output interface TD1B of the lower-layer transmission circuit 100B may be electrically coupled to the upper-layer input interface URD2. The data input interface RD1C of the lower-layer transmission circuit 100C may be electrically coupled to the upper-layer output interface UTD3, and the data output interface TD1C of the lower-layer transmission circuit 100C may be electrically coupled to the upper-layer input interface URD3. The data input interface RD1D of the lower-layer transmission circuit 100D may be electrically coupled to the upper-layer output interface UTD4, and the data output interface TD1D of the lower-layer transmission circuit 100D may be electrically coupled to the upper-layer input interface URD4.

In addition, the input control interfaces RCTLA, RCTLB, RCTLC, and RCTLD of the lower-layer transmission circuits 100A, 100B, 100C, and 100D may all be electrically coupled to the upper-layer output control interface UTCTL1, and the input clock interfaces RCLKA, RCLKB, RCLKC and RCLKD of the lower-layer transmission circuits 100A, 100B, 100C, and 100D may all be electrically coupled to the upper-layer output clock interface UTCLK1. The output control interfaces TCTLA, TCTLB, TCTLC, and TCTLD of the lower-layer transmission circuits 100A, 100B, 100C, and 100D may all be electrically coupled to the upper-layer input control interface URCTL1, and the output clock interfaces TCLKA, TCLKB, TCLKC and TCLKD of the lower-layer transmission circuits 100A, 100B, 100C, and 100D may all be electrically coupled to the upper-layer input clock interface URCLK1. That is, in the transmission system 10, the upper-layer transmission circuit UC1 may control the lower-layer transmission circuits 100A, 100B, 100C, and 100D via the same input/output control interfaces and input/output clock interfaces.

In the transmission system 10, each of the lower-layer transmission circuits 100A, 100B, 100C, and 100D may include only one data output interface and one data input interface. However, in some embodiments, the lower-layer transmission circuits 100A to 100D may include two or three data input/output interfaces.

Figure 4:
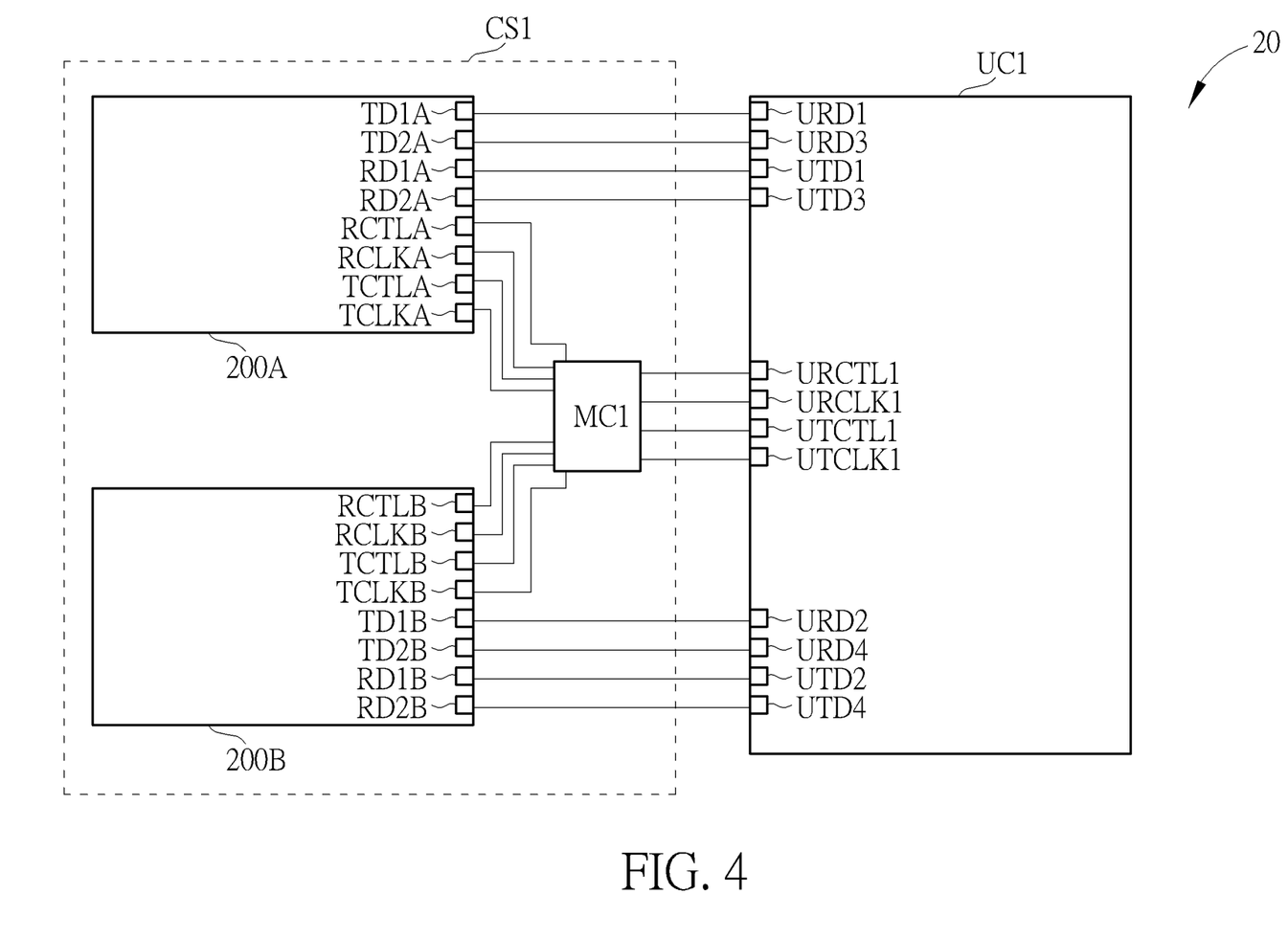
FIG. 4 is a schematic diagram of a transmission system according to another embodiment of the invention.

FIG. 4 is a schematic diagram of a transmission system 20 according to an embodiment of the invention. The transmission system 20 may include lower-layer transmission circuits 200A and 200B and an upper-layer transmission circuit UC1. The lower-layer transmission circuits 200A and 200B may have the same structure as the transmission circuit 200. The lower-layer transmission circuit 200A may include data input interfaces RD1A and RD2A, and data output interfaces TD1A and TD2A. The data input interfaces RD1A and RD2A may be electrically coupled to the upper-layer output interfaces UTD1 and UTD3, respectively, and the data output interfaces TD1A and TD2A may be electrically coupled to the upper-layer input interfaces URD1 and URD3, respectively. Similarly, the lower-layer transmission circuit 200B may include data input interfaces RD1B and RD2B and data output interfaces TD1B and TD2B. The data input interfaces RD1B and RD2B may be electrically coupled to the upper-layer output interfaces UTD2 and UTD4, respectively, and the data output interfaces TD1B and TD2B may be electrically coupled to the upper-layer input interfaces URD2 and URD4, respectively.

In other words, the lower-layer transmission circuit 200A may simultaneously receive data from the upper-layer output interfaces UTD1 and UTD3 via the data input interfaces RD1A and RD2A, and may simultaneously output data to the upper-layer input interfaces URD1 and URD3 via the data output interfaces TD1A and TD2A.

Further, in FIG. 4, the transmission system 20 may include a management control circuit MC1. The management control circuit MC1 may direct control signals and clock signals to a corresponding transmission circuit among the lower-layer transmission circuits 200A, 200B and the upper-layer transmission circuit UC1. In some embodiments, the management control circuit MC1 and the lower-layer transmission circuits 200A and 200B may be disposed on the same chip, and may be collectively regarded as a multi-physical layer circuit CS1.

In some embodiments, the management control circuit MC1 may be electrically coupled to the upper-layer output control interface UTCTL1, the upper-layer output clock interface UTCLK1, the upper-layer input control interface URCTL1, the upper-layer input clock interface URCLK1 and the lower-layer transmission circuits 200A and 200B. In other words, the management control circuit MC1 may enable the lower-layer transmission circuits 200A, 200B and the upper-layer transmission circuit UC1 to receive or transmit corresponding control signals and clock signals based on transmission requirements. By managing the control circuit MC1, the wiring between the upper-layer transmission circuit UC1 and the lower-layer transmission circuits 200A and 200B may be further simplified, delivering a flexible design of the transmission system 20.

The transmission circuit and transmission system provided by the embodiments of the present invention may include converters adopting serial signals and parallel signals, and therefore, when adopting the reduced gigabit media independent interface to transmit data between circuits, the transmission circuit may use one to three data input interfaces and one to three data output interfaces to perform data transmissions. In this fashion, the design of the transmission circuit and the wiring between each other may be simplified, thereby reducing the overall circuit area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transmission circuit comprising:
   a first data input interface;
   a first serial-to-parallel converter electrically coupled to the first data input interface, and configured to convert at least a plurality of first data signals from the first data input interface into a set of first parallel data signals, the set of first parallel data signals including a plurality of bit signals transmitted in parallel;
   an interface decoder electrically coupled to the first serial-to-parallel converter, and configured to decode the set of first parallel data signals to generate a set of decoded data signals for parallel transmission;
   a first parallel-to-serial converter electrically coupled to the interface decoder, and configured to convert the set of decoded data signals into a plurality of input data signals for serial transmission; and
   a processor circuit electrically coupled to the first parallel-to-serial converter, and configured to receive and process the plurality of input data signals.

2. The transmission circuit of claim 1, wherein:
   the interface decoder is configured to decode the set of first parallel data signals according to a reduced gigabit media independent interface (RGMII) specification; and
   the set of first parallel data signals comprises 8 bit signals transmitted in synchronization.

3. The transmission circuit of claim 1, further comprising:
   a second data input interface configured to receive the plurality of first data signals together with the first data input interface.

4. The transmission circuit of claim 1, wherein the processor circuit is further configured to generate a plurality of output data signals for serial transmission, and the transmission circuit further comprises:
   a second serial-to-parallel converter electrically coupled to the processor circuit, and configured to convert the plurality of output data signals into a set of second parallel data signals, the set of second parallel data signals comprising a plurality of bit signals transmitted in parallel;
   an interface encoder electrically coupled to the second serial-to-parallel converter, and configured to encode the set of second parallel data signals to generate a set of encoded data signals for parallel transmission;
   a second parallel-to-serial converter electrically coupled to the interface encoder, and configured to convert the set of encoded data signals into a plurality of second data signals for serial transmission; and
   a first data output interface configured to serially output at least a portion of the plurality of second data signals.

5. The transmission circuit of claim 4, further comprising:
   a second data output interface configured to output the second data signals together with the first data output interface.

6. The transmission circuit of claim 4, further comprising:
   an output control interface configured to output a control signal when outputting data via the first data output interface;
   an output clock interface configured to output a clock signal when outputting data via the first data output interface;
   an input control interface configured to receive a control signal when receiving data via the first data input interface; and
   an input clock interface configured to receive a clock signal when data is received via the first data input interface.

7. A transmission system comprising:
   an upper-layer transmission circuit comprising:
      a first upper-layer output interface; and
      a second upper-layer output interface;
   a first lower-layer transmission circuit comprising:
      a first data input interface electrically coupled to the first upper-layer output interface of the upper-layer transmission circuit;
      a first serial-to-parallel converter electrically coupled to the first data input interface, and configured to convert at least a plurality of first data signals from the first data input interface into a set of first parallel data signals, the set of first parallel data signals including a plurality of bit signals transmitted in parallel;

a first interface decoder electrically coupled to the first serial-to-parallel converter, and configured to decode the set of first parallel data signals to generate a set of first decoded data signals for parallel transmission;

a first parallel-to-serial converter electrically coupled to the first interface decoder, and configured to convert the set of first decoded data signals into a plurality of first input data signals for serial transmission; and a first processor circuit electrically coupled to the first parallel-to-serial converter, and configured to receive and process the plurality of first input data signals; and a second lower-layer transmission circuit comprising:

a second data input interface electrically coupled to the second upper-layer output interface of the upper-layer transmission circuit;

a second serial-to-parallel converter electrically coupled to the second data input interface, and configured to convert at least a plurality of second data signals from the second data input interface into a set of second parallel data signals, the set of second parallel data signals including a plurality of bit signals transmitted in parallel;

a second interface decoder electrically coupled to the second serial-to-parallel converter, and configured to decode the set of second parallel data signals to generate a set of second decoded data signals for parallel transmission;

a second parallel-to-serial converter electrically coupled to the second interface decoder, and configured to convert the set of second decoded data signals into a plurality of second input data signals for serial transmission; and a second processor circuit electrically coupled to the second parallel-to-serial converter, and configured to receive and process the plurality of second input data signals.

8. The transmission system of claim 7, wherein:
the upper-layer transmission circuit corresponds to a data link layer; and
the first lower-layer transmission circuit and the second lower-layer transmission circuit correspond to a physical layer.

9. The transmission system of claim 8, wherein:
the first interface decoder is configured to decode the set of first parallel data signals according to a reduced gigabit media independent interface (RGMII) specification;
the first interface decoder and the second interface decoder decode the set of second parallel data signals according to the RGMII specification; and
the set of first parallel data signals comprises 8 bit signals transmitted in synchronization, and the set of second parallel data signals comprises 8 bit signals transmitted in synchronization.

10. The transmission system of claim 7, wherein:
the upper-layer transmission circuit further comprises:
an upper-layer output control interface configured to output a control signal when outputting data via the first upper-layer output interface and the second upper-layer output interface; and
an upper-layer output clock interface configured to output a clock signal when outputting data via the first upper-layer output interface and the second upper-layer output interface;

the first lower-layer transmission circuit further comprises:
a first input control interface electrically coupled to the upper-layer output control interface; and
a first input clock interface electrically coupled to the upper-layer output clock interface; and the second lower-layer transmission circuit further comprises:
a second input control interface electrically coupled to the upper-layer output control interface; and
a second input clock interface electrically coupled to the upper-layer output clock interface.

11. The transmission system of any of claim 7, wherein:
the upper-layer transmission circuit further comprises:
a third upper-layer output interface; and
the first lower-layer transmission circuit further comprises
a third data input interface electrically coupled to the third upper-layer output interface and configured to receive the plurality of first data signals together with the first data input interface.

12. The transmission system of claim 11, wherein:
the upper-layer transmission circuit further comprises:
a fourth upper-layer output interface; and
the second lower-layer transmission circuit further comprises a fourth data input interface electrically coupled to the fourth upper-layer output interface and configured to receive the plurality of second data signals together with the second data input interface.

13. The transmission system of any of claim 7, wherein:
the upper-layer transmission circuit further comprises:
a first upper-layer input interface; and
a second upper-layer input interface;

the first lower-layer transmission circuit further comprises:
a third serial-to-parallel converter electrically coupled to the first processor circuit, and configured to convert the plurality of first output data signals generated by the first processor circuit into a set of third parallel data signals, the set of third parallel data signals comprising a plurality of bit signals transmitted in parallel;

a first interface encoder electrically coupled to the third serial-to-parallel converter, and configured to encode the set of third parallel data signals to generate a set of first encoded data signals for parallel transmission;

a third parallel-to-serial converter electrically coupled to the first interface encoder, and configured to convert the set of first encoded data signals into a plurality of third data signals for serial transmission; and a first data output interface electrically coupled to the first upper-layer input interface and configured to serially output at least a portion of the plurality of third data signals; and the second lower-layer transmission circuit further comprises:
a fourth serial-to-parallel converter electrically coupled to the second processor circuit, and configured to convert the plurality of second output data signals generated by the second processor circuit into a set of fourth parallel data signals, the set of fourth parallel data signals comprising a plurality of bit signals transmitted in parallel;

a second interface encoder electrically coupled to the fourth serial-to-parallel converter, and configured to encode the set of fourth parallel data signals to generate a set of second encoded data signals for parallel transmission;

a fourth parallel-to-serial converter electrically coupled to the second interface encoder, and configured to convert the set of second encoded data signals into a plurality of fourth data signals for serial transmission; and a second data output interface electrically coupled to the second upper-layer input interface and configured to serially output at least a portion of the plurality of fourth data signals.

14. The transmission system of claim 13, wherein:
the upper-layer transmission circuit further comprises:
an upper-layer input control interface configured to receive a control signal when receiving data via the first upper-layer input interface and the second upper-layer input interface; and
an upper-layer input clock interface configured to receive a clock signal when receiving the data via the first upper-layer input interface and the second upper-layer input interface;
the first lower-layer transmission circuit further comprises:
a first output control interface electrically coupled to the upper-layer input control interface; and
a first output clock interface electrically coupled to the upper-layer input clock interface; and
the second lower-layer transmission circuit further comprises:
a second output control interface electrically coupled to the upper-layer input control interface; and
a second output clock interface electrically coupled to the upper-layer input clock interface.

15. The transmission system of claim 14, wherein:
the upper-layer transmission circuit further comprises:
a third upper-layer input interface;
a fourth upper-layer input interface;
a third upper-layer output interface; and
a fourth upper-layer output interface;
the transmission system further comprises:
a third lower-layer transmission circuit electrically coupled to the third upper-layer output interface, the third upper-layer input interface, the upper-layer input control interface, the upper-layer input clock interface, the upper-layer output control interface, and the upper-layer output clock interface: and
a fourth lower-layer transmission circuit electrically coupled to the fourth upper-layer output interface, the fourth upper-layer input interface, the upper-layer input control interface, the upper-layer input clock interface, the upper-layer output control interface, and the upper-layer output clock interface.

16. The transmission system of claim 13, wherein:
the upper-layer transmission circuit further comprises:
a third upper-layer input interface; and
the first lower-layer transmission circuit further comprises
a third data output interface electrically coupled to the third upper-layer input interface and configured to output the plurality of third data signals together with the first data input interface.

17. The transmission system of claim 16, wherein:
the upper-layer transmission circuit further comprises:
a fourth upper-layer input interface; and
the second lower-layer transmission circuit further comprises a fourth data output interface electrically coupled to the fourth upper-layer input interface and configured to output the plurality of fourth data signals together with the second data input interface.

* * * * *